(12) United States Patent
Chang

(10) Patent No.: US 7,759,989 B2
(45) Date of Patent: Jul. 20, 2010

(54) TIME DELAY CIRCUIT FOR USE IN A RESET CIRCUIT

(75) Inventor: Jung-Lin Chang, Taipei County (TW)

(73) Assignee: Chi Mei Communication Systems, Inc., Tu-Cheng, Taipei County (TW)

( * ) Notice: Subject to any disclaimer, the term of this patent is extended or adjusted under 35 U.S.C. 154(b) by 54 days.

(21) Appl. No.: 12/327,951

(22) Filed: Dec. 4, 2008

(65) Prior Publication Data

US 2010/0039155 A1  Feb. 18, 2010

(30) Foreign Application Priority Data

Aug. 15, 2008  (TW)  ............... 97131225 A

(51) Int. Cl.
*H03L 7/00* (2006.01)
(52) U.S. Cl. ...................... 327/143; 327/142
(58) Field of Classification Search .............. None
See application file for complete search history.

(56) References Cited

U.S. PATENT DOCUMENTS 5,770,959 A * 6/1998 Hopkins et al. ............ 327/143
2002/0011882 A1 * 1/2002 Ozeki et al. ................ 327/143
2005/0140405 A1 * 6/2005 Do et al. .................... 327/143
2008/0238499 A1 * 10/2008 Mawet ....................... 327/143
2009/0174443 A1 * 7/2009 Li et al. ..................... 327/143
2009/0267659 A1 * 10/2009 Li et al. ..................... 327/143

FOREIGN PATENT DOCUMENTS

JP  4-277922  * 10/1992

* cited by examiner

*Primary Examiner*—Tuan Lam
(74) *Attorney, Agent, or Firm*—Steven M. Reiss

(57) ABSTRACT

A time delay circuit for providing a time delay to a reset circuit includes a first circuit, a second circuit, an AND gate and a control signal input. The first circuit includes a first resistor and a first capacitor. The second circuit includes a second resistor and a second capacitor. The AND gate includes a first input, a second input and an output. The first capacitor includes an input coupled to a power source via the first resistor, and an output grounded. The second capacitor includes an input coupled to the control signal input and an output grounded. The first input of the AND gate is coupled to the input of the first capacitor, the second input coupled to the input of the second capacitor, and the output configured for coupling to a integrated circuit to reset.

11 Claims, 1 Drawing Sheet

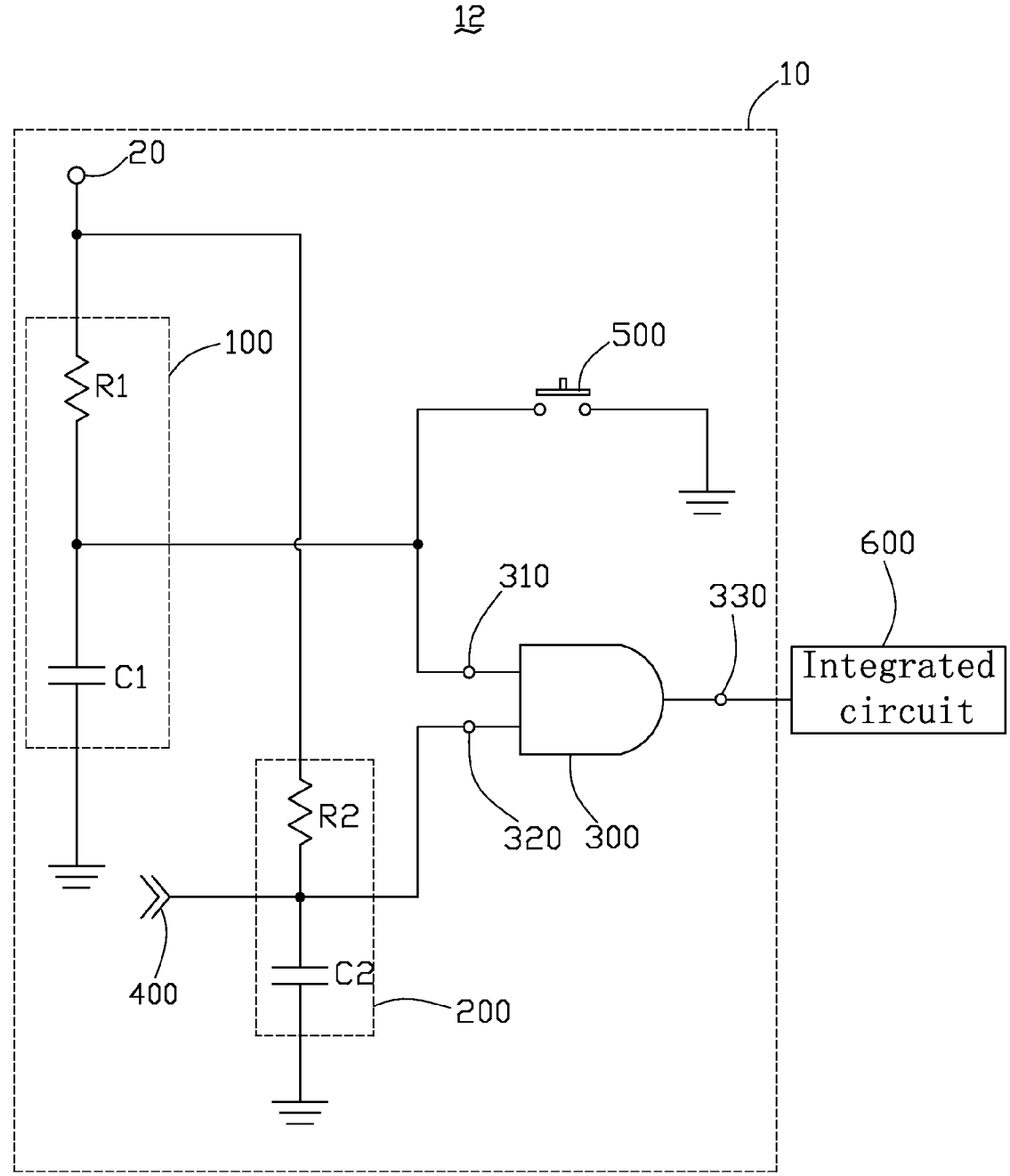

TIME DELAY CIRCUIT FOR USE IN A RESET CIRCUIT

BACKGROUND

1. Technical Field

The present disclosure relates to a time delay circuit for use in a reset circuit.

2. Description of the Related Art

In electronic systems, a reset function is widely used to clear pending errors or events. When chips have a run error, a time delay is needed for the chips to reset. Therefore, a time delay circuit is employed in a reset circuit to provide the time delay. Current time delay circuits are typically an integrated chip, such as a power source comparison chip, which is costly.

What is needed, therefore, is a time delay circuit for use in reset circuit, which can overcome the above-described problem.

BRIEF DESCRIPTION OF THE DRAWINGS

Many aspects of the present time delay circuit use should be better understood with reference to the accompanying drawing. The components in the drawing are not necessarily drawn to scale, the emphasis instead being placed upon clearly illustrating the principles of the time delay circuit. Moreover, in the drawings, like reference numerals designate corresponding parts throughout the several views.

The FIGURE is a schematic view of a time delay circuit use in a reset circuit in accordance with an exemplary embodiment.

DETAILED DESCRIPTION

Embodiments of the present time delay circuit use will now be described in detail with reference to the drawing.

Referring to FIG. 1, one embodiment of a time delay circuit 10 used in a reset circuit 12 for providing a time delay to reset an integrated circuit 600. According to an exemplary embodiment, the time delay circuit 10 includes a first circuit 100, a second circuit 200, an AND gate 300, and a control signal input 400.

The first circuit 100 includes a first resistor R1 and a first capacitor C1. The second circuit 200 includes a second resistor R2 and a second capacitor C2. The AND gate 300 includes a first input 310, a second input 320, and output 330.

The first resistor R1 includes an input coupled to a power source 20, and an output. The first capacitor C1 includes an input coupled to the output of the first resistor R1 and an output coupled to the ground. The input of the first capacitor C1 is coupled to the power source 20 by the first resistor R1. In this embodiment, the first resistor R1 is about 100K ohms, and the first capacitor C1 is 1 microfarad.

The second resistor R2 includes an input coupled to the power source 20 and an output. The second capacitor C2 includes an input coupled to the output of the second resistor R2, and an output coupled to the ground. In this embodiment, the resistance value of the first resistor R1 is equal to that of the second resistor R2. The capacitance value of the first capacitor C1 is equal to that of the second capacitor C2. It should be noted that the resistance value of the first resistor R1, the second resistor R2, and the capacitance value of the first capacitor C1 and the second capacitor C2 are not limited by this embodiment, but can be configured depending on requirements. In other alternative embodiments, the resistance value of the first resistor R1 is greater than that of the second resistor R2, and the capacitance value of the first capacitor C1 is greater than that of the second capacitor C2.

The AND gate 300 includes a first input 310, a second input 320 and an output 330. The first input 310 is coupled to the input of the first capacitor C1. The second input 320 is coupled to the input of the second capacitor C2. The output 330 of the AND gate 300 is coupled to the integrated circuit 600 that needs to be reset. The integrated circuit 600 can be a main board chip or a power supply chip, for example.

The control signal input 400 is coupled to the output of the second resistor R2 and configured for providing a LOW level control signal such as about 0V, to the junction of the second resistor R2 and the second capacitor C2. In this embodiment, the control signal input 400 is coupled to a watchdog chip (not shown). The watchdog chip is configured for detecting running errors of the integrated circuit 600. If the watchdog chip detects that the integrated circuit 600 has a run error, the watchdog chip sends a reset signal, i.e., a LOW level signal, to the control signal input 400. As a result, the second input 320 receives a LOW level signal too, and therefore the AND gate 300 outputs a LOW level signal to reset the integrated circuit 600 coupled thereto.

In this embodiment, the time delay circuit 10 further includes a switch 500 configured for manually resetting the integrated circuit 600. A first end of the switch 500 is coupled to the junction of the first resistor R1 and the first capacitor C1, and a second end is grounded. The switch 500 is a depress type switch.

In operation, initially, the power source 20 provides a HIGH level signal, e.g., about 3.3 volts in one embodiment, to the first capacitor C1 via first resistor R1, and the second capacitor C2 via the second resistor R2. Accordingly, both the capacitors C1, C2 begin to charge to about the HIGH volt level. After charging of the capacitors C1, C2 to about the HIGH volt level, the first and second inputs 310, 320 of the AND gate 300 receive the HIGH level signal. As a result, the output 330 of the AND gate 300 also changes to the HIGH level signal from the original LOW level signal, and output the HIGH level signal to the integrated circuit 600. The integrated circuit 600 boots up. However, the boot-up is time delayed by the time delay circuit 10. According to charging formula of a RC circuit: T=RC, where T is the charging time, i.e., the time delay, R is the resistance value of the resistor of the RC circuit, and C is the capacitance value of the capacitor of the RC circuit. That is, the integrated circuit 600 have time T to boot up. It should be noted that the charging time of the first capacitor C1 and the second capacitor C2 can be set according to the resistance value of the resistors R1, R2, and the capacity value of the capacitors C1, C2. In this embodiment, charging times of the first capacitor C1 and the second capacitor C2 are greater than a rest time of the integrated circuit 600.

When any chip of the integrated circuit 600 has a run error, the watchdog chip detects the run error and sends a reset signal, i.e., the LOW level signal, to the control signal input 400. As a consequence, the output 330 outputs the LOW level signal to the chip to power off the integrated circuit 600. Then, the second capacitor C2 discharges and recharges, providing a time delay of about 2T1, where T1=R2C2, for the integrated circuit 600 power on again. That is, the integrated circuit 600 has a time delay time of about 2T1 to reboot.

In other alternative embodiments, if the integrated circuit 600 is to be manually reset, the switch 500 can be actuated. After actuation, the first capacitor C1 is grounded. The first input 310 receives a LOW level signal. As a result, the output 330 of the AND gate 300 also outputs a LOW level signal to the integrated circuit 600. Meantime, the first capacitor C1 discharges and recharges. This process also provides 2T2, where T2=R1C1, for the integrated circuit 600 to reboot.

The time delay circuit 10 is capable of providing a time delay for the integrated circuit 600 to reboot, and therefore can be adopted in a variety of devices. Despite of its great commercial value, all components thereof are inexpensive. Therefore, this time delay circuit 10 should be more desired by commercial practice.

It will be understood that the above particular embodiments and methods are shown and described by way of illustration only. The principles and the features of the present invention may be employed in various and numerous embodiment thereof without departing from the scope of the invention as claimed. The above-described embodiments illustrate the scope of the invention but do not restrict the scope of the invention.

What is claimed is:

1. A time delay circuit for providing a time delay to a reset circuit, the time delay circuit comprising:
   a control signal input;
   a first circuit comprising:
      a first resistor comprising an output and an input coupled to a power source; and
      a first capacitor comprising an input coupled the output of the first resistor and an output coupled to ground;
   a second circuit comprising:
      a second resistor comprising an input coupled to the power source and an output coupled to the control signal input, and
      a second capacitor comprising an input coupled to the control signal input and an output coupled to ground; and
   an AND gate comprising a first input coupled to the input of the first capacitor, a second input coupled to the input of the second capacitor, and an output configured for coupling to an integrated circuit to control the integrated circuit to reset.

2. The time delay circuit as claimed in claim 1, wherein charging times of the first capacitor and the second capacitor are greater than a rest time of the integrated circuit.

3. The time delay circuit as claimed in claim 1, wherein the control signal input is configured for coupling to a watchdog chip, the watchdog chip configured for detecting running errors of the integrated circuit, and sending a reset signal to the control signal input so as to provide a low level signal to the second input of the AND gate, such that the AND gate outputs a low level signal to reset the integrated circuit.

4. The time delay circuit as claimed in claim 3, wherein the reset signal is a low signal input.

5. The time delay circuit as claim in claim 3, wherein the signal input and the low level signal are about 0 volts.

6. A time delay circuit for providing a time delay to a reset circuit, the time delay circuit comprising:
   a control signal input;
   a first circuit comprising:
      a first resistor comprising an output and an input coupled to a power source; and
      a first capacitor comprising an input coupled the output of the first resistor and an output coupled to ground;
   a second circuit comprising:
      a second resistor comprising an input coupled to the power source and an output coupled to the control signal input, and
      a second capacitor comprising an input coupled to the control signal input and an output coupled to ground; and
   an AND gate comprising a first input coupled to the input of the first capacitor, a second input coupled to the input of the second capacitor, and an output configured for coupling to an integrated circuit to control the integrated circuit to reset; and
   a switch configured for manually resetting the integrated circuit, a first end of the switch is coupled to the junction of the first resistor and the first capacitor, and a second end is coupled to ground.

7. The time delay circuit as claimed in claim 6, wherein charging times of the first capacitor and the second capacitor are greater than a rest time of the integrated circuit.

8. The time delay circuit as claimed in claim 6, wherein the control signal input is configured for coupling to a watchdog chip, the watchdog chip configured for detecting running errors of the integrated circuit, and sending a reset signal to the control signal input so as to provide a low level signal to the second input of the AND gate, such that the AND gate outputs a low level signal to reset the integrated circuit.

9. The time delay circuit as claimed in claim 8, wherein the reset signal is a low signal input.

10. The time delay circuit as claim in claim 8, wherein the low signal input and the low level signal are about 0 volts.

11. The time delay circuit as claimed in claim 6, wherein the switch is a depress type switch.

* * * * *